United States Patent
Hassanin et al.

(10) Patent No.: US 10,673,443 B1
(45) Date of Patent: Jun. 2, 2020

(54) MULTI-RING CROSS-COUPLED VOLTAGE-CONTROLLED OSCILLATOR

(71) Applicant: Kandou Labs, S.A., Lausanne (CH)

(72) Inventors: Abdelsalam Ahmed Hassanin, Lausanne (CH); Kiarash Gharibdoust, Lonay (CH); Milad Ataei Ashtiani, Saint-Suplice (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/378,459

(22) Filed: Apr. 8, 2019

(51) Int. Cl.
| | |
|---|---|
| *H03L 7/099* | (2006.01) |
| *H04L 7/033* | (2006.01) |
| *H04L 7/00* | (2006.01) |
| *G06F 1/10* | (2006.01) |
| *H03L 7/081* | (2006.01) |
| *H03L 7/085* | (2006.01) |
| *H02M 7/42* | (2006.01) |

(52) U.S. Cl.
CPC .............. *H03L 7/0996* (2013.01); *G06F 1/10* (2013.01); *H02M 7/42* (2013.01); *H03L 7/081* (2013.01); *H03L 7/085* (2013.01); *H04L 7/0012* (2013.01); *H04L 7/0025* (2013.01); *H04L 7/033* (2013.01)

(58) Field of Classification Search
CPC .................................................... H03L 7/0996
USPC ............................................................ 331/57
See application file for complete search history.

(56) References Cited

U.S. PATENT DOCUMENTS

| | | | |
|---|---|---|---|
| 4,839,907 A | 6/1989 | Saneski | |
| 5,266,907 A | 11/1993 | Dacus | |
| 5,528,198 A | 6/1996 | Baba et al. | |
| 5,602,884 A | 2/1997 | Wieczorkiewicz et al. | |
| 5,629,651 A | 5/1997 | Mizuno | |
| 5,802,356 A | 9/1998 | Gaskins et al. | |
| 6,026,134 A | 2/2000 | Duffy et al. | |
| 6,307,906 B1 | 10/2001 | Tanji et al. | |
| 6,316,987 B1 | 11/2001 | Dally et al. | |

(Continued)

FOREIGN PATENT DOCUMENTS

| | | |
|---|---|---|
| CN | 203675093 U | 6/2014 |
| EP | 0740423 A2 | 10/1996 |

OTHER PUBLICATIONS

Loh, Mattew, et al., "A 3x9 Gb/s Shared, All-Digital CDR for High-Speed, High-Density I/O", IEEE Journal of Solid-State Circuits, vol. 47, No. 3, Mar. 2012, 641-651 (11 pages).

(Continued)

*Primary Examiner* — Joseph Chang
(74) *Attorney, Agent, or Firm* — Invention Mine LLC

(57) ABSTRACT

Two rings of a voltage controlled oscillator (VCO) configured to generate a plurality of phases of an oscillator signal, each ring of the two rings comprising three stages of inverters configured to generate a subset of phases of the plurality of phases of the oscillator signal, cross coupled via each stage to a corresponding stage in an other ring of the two rings using inverters to inverse-phase lock the subsets of phases of the plurality of phases of the oscillator signal of the two rings, and configured to receive inputs at each stage from a previous stage in the ring and a feed-forward signal from a successive stage in the other ring of the two rings, and a tail current supply configured to supply the two rings of the VCO with a tail current, the tail current comprising a low-magnitude proportional component and a high-magnitude integral component.

20 Claims, 5 Drawing Sheets

(56) References Cited

U.S. PATENT DOCUMENTS

| | | |
|---|---|---|
| 6,380,783 B1 | 4/2002 | Chao et al. |
| 6,389,091 B1 | 5/2002 | Yamaguchi et al. |
| 6,509,773 B2 | 1/2003 | Buchwald et al. |
| 6,717,478 B1 | 4/2004 | Kim et al. |
| 7,199,728 B2 | 4/2007 | Dally et al. |
| 7,336,112 B1 | 2/2008 | Sha et al. |
| 7,535,957 B2 | 5/2009 | Ozawa et al. |
| 7,616,075 B2 | 11/2009 | Kushiyama |
| 7,650,525 B1 | 1/2010 | Chang et al. |
| 7,688,929 B2 | 3/2010 | Co |
| 7,860,190 B2 | 12/2010 | Feller |
| 8,036,300 B2 | 10/2011 | Evans et al. |
| 8,253,454 B2 | 8/2012 | Lin |
| 8,791,735 B1 | 7/2014 | Shibasaki |
| 9,036,764 B1 | 5/2015 | Hossain et al. |
| 9,059,816 B1 | 6/2015 | Simpson et al. |
| 9,306,621 B2 | 4/2016 | Zhang et al. |
| 9,374,250 B1 | 6/2016 | Musah et al. |
| 9,397,868 B1 | 7/2016 | Hossain et al. |
| 9,438,409 B1 | 9/2016 | Liao et al. |
| 9,520,883 B2 | 12/2016 | Shibasaki |
| 9,565,036 B2 | 2/2017 | Zerbe et al. |
| 9,577,815 B1 | 2/2017 | Simpson et al. |
| 9,602,111 B1 | 3/2017 | Shen et al. |
| 9,906,358 B1 | 2/2018 | Tajalli |
| 9,960,902 B1 | 5/2018 | Lin et al. |
| 10,055,372 B2 | 8/2018 | Shokrollahi |
| 10,374,787 B2 | 8/2019 | Tajalli |
| 2003/0001557 A1 | 1/2003 | Pisipaty |
| 2003/0146783 A1 | 8/2003 | Bandy et al. |
| 2004/0092240 A1 | 5/2004 | Hayashi |
| 2005/0024117 A1 | 2/2005 | Kubo et al. |
| 2005/0084050 A1 | 4/2005 | Cheung et al. |
| 2005/0117404 A1 | 6/2005 | Savoj |
| 2005/0128018 A1 | 6/2005 | Meltzer |
| 2005/0201491 A1 | 9/2005 | Wei |
| 2005/0220182 A1 | 10/2005 | Kuwata |
| 2005/0275470 A1 | 12/2005 | Choi |
| 2006/0140324 A1 | 6/2006 | Casper et al. |
| 2006/0232461 A1 | 10/2006 | Felder |
| 2007/0001713 A1 | 1/2007 | Lin |
| 2007/0001723 A1 | 1/2007 | Lin |
| 2007/0047689 A1 | 3/2007 | Menolfi et al. |
| 2007/0147559 A1 | 6/2007 | Lapointe |
| 2007/0201597 A1 | 8/2007 | He et al. |
| 2008/0007367 A1 | 1/2008 | Kim |
| 2008/0165841 A1 | 7/2008 | Wall et al. |
| 2008/0181289 A1 | 7/2008 | Moll |
| 2008/0317188 A1 | 12/2008 | Staszewski et al. |
| 2009/0103675 A1 | 4/2009 | Yousefi et al. |
| 2009/0167389 A1 | 7/2009 | Reis |
| 2009/0195281 A1 | 8/2009 | Tamura et al. |
| 2009/0231006 A1 | 9/2009 | Jang et al. |
| 2009/0262876 A1 | 10/2009 | Arima et al. |
| 2010/0156543 A1* | 6/2010 | Dubey ............ H03K 3/0315 331/50 |
| 2010/0180143 A1 | 7/2010 | Ware et al. |
| 2010/0220828 A1 | 9/2010 | Fuller et al. |
| 2011/0002181 A1 | 1/2011 | Wang et al. |
| 2011/0025392 A1 | 2/2011 | Wu et al. |
| 2011/0311008 A1 | 12/2011 | Slezak et al. |
| 2012/0206177 A1 | 8/2012 | Colinet et al. |
| 2012/0327993 A1 | 12/2012 | Palmer |
| 2013/0088274 A1 | 4/2013 | Gu |
| 2013/0091392 A1 | 4/2013 | Valliappan et al. |
| 2013/0207706 A1 | 8/2013 | Yanagisawa |
| 2013/0243127 A1 | 9/2013 | Ito et al. |
| 2013/0271194 A1 | 10/2013 | Madoglio et al. |
| 2013/0285720 A1 | 10/2013 | Jibry |
| 2013/0314142 A1 | 11/2013 | Tamura et al. |
| 2014/0286381 A1 | 9/2014 | Shibasaki |
| 2015/0078495 A1 | 3/2015 | Hossain et al. |
| 2015/0117579 A1 | 4/2015 | Shibasaki |
| 2015/0180642 A1 | 6/2015 | Hsieh et al. |
| 2015/0220472 A1 | 8/2015 | Sengoku |
| 2015/0256326 A1 | 9/2015 | Simpson et al. |
| 2016/0056980 A1 | 2/2016 | Wang et al. |
| 2016/0134267 A1 | 5/2016 | Adachi |
| 2017/0310456 A1 | 10/2017 | Tajalli |
| 2018/0083763 A1 | 3/2018 | Black et al. |
| 2018/0375693 A1 | 12/2018 | Zhou et al. |

OTHER PUBLICATIONS

Riley, M. W., et al., "Cell Broadband Engine Processor: Design and Implementation", IBM Journal of Research and Development, vol. 51, No. 5, Sep. 2007, 545-557 (13 pages).

* cited by examiner

MULTI-RING CROSS-COUPLED VOLTAGE-CONTROLLED OSCILLATOR

REFERENCES

The following prior applications are herein incorporated by reference in their entirety for all purposes:

U.S. patent application Ser. No. 16/107,822 filed Aug. 21, 2018, entitled "High Performance Phase Locked Loop", naming Armin Tajalli, hereinafter referred to as [Tajalli I].

FIELD OF THE INVENTION

The present embodiments relate to communications systems circuits generally, and more particularly to obtaining a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In such vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. Such Clock and Data Recovery (CDR) not only determines the appropriate sample timing, but may continue to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

To reliably detect the data values transmitted over a communications system, a receiver measures the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream. In general, the receiver embodiments of such timing methods are described as Clock-Data Recovery (CDR) or alternatively as Clock-Data Alignment (CDA) often based on Phase-Lock Loop (PLL) or Delay-Locked Loop (DLL) synthesis of a local receive clock having the desired frequency and phase characteristics.

In both PLL and DLL embodiments, a phase comparator compares the relative phase (and in some variations, the relative frequency) of a received reference signal and a local clock signal to produce an error signal, which is subsequently used to correct the phase and/or frequency of the local clock source and thus minimize the error. As this feedback loop behavior will lead to a given PLL embodiment producing a fixed phase relationship (as examples, 0 degrees or 90 degrees of phase offset) between the reference signal and the local clock, an additional fixed or variable phase adjustment is often introduced to permit the phase offset to be set to a different desired value (as one example, 45 degrees of phase offset) to facilitate receiver data detection.

Methods and systems are described herein for generating a plurality of phases of an oscillator signal via two rings of a voltage controlled oscillator (VCO), each ring of the two rings (i) generating a subset of the phases of the plurality of phases of the oscillator signal at outputs of three stages of inverters, (ii) inverse-phase locking the subsets of phases of the plurality of phases of the oscillator signal of the two rings of each stage to a corresponding stage in an other ring of the two rings using inverters, and (iii) receiving inputs at each stage from a previous stage in the ring and a feed-forward signal from a successive stage in the other ring of the two rings, generating a tail current at a tail current supply, the tail current comprising a low-magnitude proportional component associated with high-frequency phase comparisons and a high-magnitude integral component associated with an accumulation of phase comparison, and supplying the two rings of the VCO with the tail current.

In some embodiments, synthesis of additional local clock phases is desirable to enable multi-phase or pipelined processing of received data values, facilitate phase interpolation, and/or provide additional inputs to the phase detection process to reduce clock jitter and/or improve PLL closed-loop bandwidth. As one example, [Tajalli I] describes an embodiment in which multiple voltage-controlled oscillator (VCO) phases and (optionally, multiple delayed) instances of a received clock reference are compared using a matrix of phase comparator elements, the multiple partial phase error signals of which are combined in a weighed summation to provide a VCO phase error correction.

VCOs utilizing ring-connected strings of active circuit elements are well represented in the art. The basic oscillation frequency of such a VCO is determined by the total propagation time of the string of active element. Thus, to enable high-speed operation, a simple digital inverter having minimal propagation delay is typically used as the active element. Ring-connected strings of differential amplifiers or buffers are also known, with stable oscillation occurring as long as the overall phase shift at the desired oscillation frequency is an odd multiple of 180 degrees.

The ring oscillation frequency may be varied using a control signal that adjusts active circuit element delay, which may in turn be functions of circuit gain and switching threshold. Alternatively, the effective propagation delay may be increased by limiting the skew rate of signal transitions propagating between ring elements, either explicitly by constraining the output current drive of each active circuit element, or implicitly by constraining the supply voltage or current provided to each active circuit element.

Conveniently, an N-element ring oscillator inherently provides N multiple clock output phases, each typically offset by 180/N degrees of phase difference. Thus, a ring oscillator comprising three identical single-ended digital inverters can provide three distinct phases of oscillator output signal.

DETAILED DESCRIPTION

Figure 1:
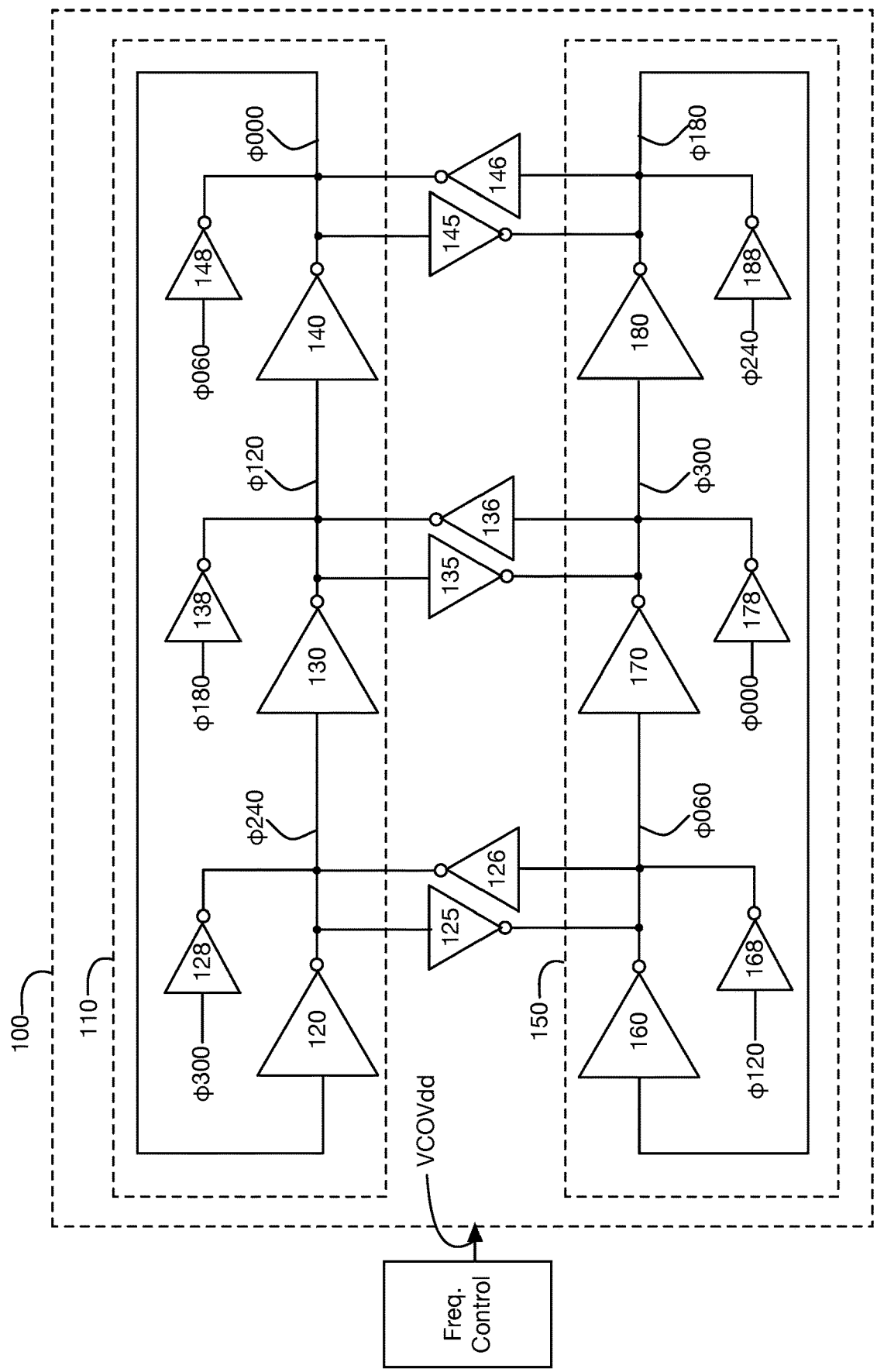
FIG. 1 is a block diagram showing one embodiment of a two ring, three stage per ring variable frequency oscillator.

To reliably detect the data values transmitted over a communications system, a receiver measures the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream. In general, the receiver embodiments of such timing methods are described as Clock-Data Recovery (CDR) or alternatively as Clock-Data Alignment (CDA) often based on Phase-Lock Loop (PLL) or Delay-Locked Loop (DLL) synthesis of a local receive clock having the desired frequency and phase characteristics.

A typical PLL is composed of a phase comparator that compares an external reference signal to an internal clock signal, a low pass filter that smooths the resulting error value to produce a clock control signal, and a variable frequency clock source (typically, a Voltage Controlled Oscillator or VCO) controlled by the smoothed error value, producing the internal clock signal presented to the phase comparator. In a well-know variation, such a PLL design may incorporate a clock frequency divider between the VCO and the phase comparator, allowing a higher-frequency clock output to be phase locked to a lower-frequency reference signal.

In an alternative Delay-Locked Loop (DLL) embodiment, the variable frequency clock source is replaced by a variable delay element, having (optionally multiple tapped) outputs representing one or more successive time-delayed versions of the original input signal rather than successive cycles of an oscillator to be phase compared to the reference input signal. For the purposes of this document, the variable delay elements utilized in a DLL are considered functionally equivalent to the variable delay elements of a ring-connected oscillator VCO in a PLL embodiment.

In some embodiments, the PLL may synthesize additional local clock phases to enable multi-phase or pipelined processing of received data values, facilitate phase interpolation, and/or provide additional inputs to the phase detection process to reduce clock jitter and/or improve PLL closed-loop bandwidth. As one example, [Tajalli I] describes an embodiment in which multiple VCO phases and (optionally, multiple delayed) instances of a received clock reference are compared using a matrix of phase comparator elements, the multiple partial phase error signals of which are combined in a weighed summation to provide a VCO phase error correction.

A simple digital XOR gate may be used as a phase comparator. As a non-limiting example, an XOR between two square wave signals having a phase difference will result in a variable-duty-cycle waveform which, when low pass filtered into an analog error signal, results in a proportional error signal centered in its analog signal range when the two input signals have a 90-degree phase offset relationship. More complex finite state machine (FSM) phase comparator compare the relative arrival times of clock transitions, as one example using edge-triggered latches clocked respectively by the reference and internal clock signals, with the relative arrival time of the clock edges resulting in an "early" or "late" output signal that produces a corresponding correction of the VCO phase. Other FSM phase comparator embodiments are additionally sensitive to clock frequency differences, enabling faster initial loop lock at startup. Further embodiments accumulate multiple phase error measurements into an integral error result which may be used alone or in combination with a short-term proportional result as a VCO control value. Some embodiments incorporate some or all of these functions into firmware or software executing on a CPU, or implemented as a hardware state machine.

In most PLL embodiments, the error signal produced by the phase comparator is low pass filtered and applied as an analog control voltage used to adjust the VCO operating frequency.

The control signal used to adjust the VCO frequency may be composed of multiple components; a proportional component formed from phase comparisons of a reference and a local clock signal by a phase comparator, a matrix of multiple such comparisons as taught in [Tajalli I], the output of a FSM performing frequency or phase comparisons, as well as an integral component derived from an accumulated history of phase measurements. In some embodiments, a first control signal component may correspond to a long time constant correction and a second control signal component may correspond to a short time constant correction. Identical or different weights or scaling factors may be applied to said first and second control components when they are combined.

In an alternative embodiment, all or part of the filtering operation are subsumed into the same digital processing used for phase comparison, with the digital error result applied to a digital-to-analog converter (DAC) to obtain an analog VCO control signal. In further embodiments, all or a portion of the VCO control signal may be applied in the digital domain.

Voltage-controlled oscillators operate responsive to an initial signal transitioning and propagating down the string of connected elements, appearing at consecutive element outputs after a delay determined by the signal propagation delay of the active circuit element. Thus, as one example offered without limitation, the initial signal transition would appear at the end of a series-connected string of four active circuit elements after (4*prop_delay), corresponding to one half-cycle of the oscillator. If the output is inverted and applied to the input (thus, the term "ring-connected") the oscillation will continue for another half period, resulting in a square wave output with a period of (2*Σprop_delay), determined by the total propagation time Σprop_delay of the string of active elements. The number of active circuit elements in the ring may vary, with oscillation occurring as long as the overall phase shift of the string at the desired oscillation frequency is an odd multiple of 180 degrees. Thus, to enable high-speed oscillation, the string length is kept short and minimal-delay active elements such as simple digital inverters, amplifiers, or buffers are used.

The ring oscillation frequency may be varied using a control signal that adjusts an active circuit element parameter affecting propagation delay, such as gain, switching threshold, or output drive; low frequency embodiments are also known that incorporate configurable passive delay elements between active stages to provide additional control. At high frequencies, a significant component of an active element's propagation time can be the node charge/discharge time required for an output state change in one element to charge or discharge the parasitic capacitance of the interconnecting node and reach the switching threshold of the subsequent element's input. Under these conditions, the effective propagation delay may be varied by limiting the skew rate of signal transitions propagating between ring elements, either by explicitly adjusting the output current drive capability or output impedance of each active circuit element, or by implicitly making such adjustment by varying the supply voltage or current provided to the active circuit elements.

Conveniently, an N-element 1ring oscillator inherently generates N multiple clock output phases as the output of consecutive active elements, each typically offset by an additional 180/N degrees of phase difference. In embodiments based on inverting active elements, an additional 180-degree offset (i.e. inversion) will be seen at odd-numbered outputs, using the input of the first element as the reference.

Figure 5:
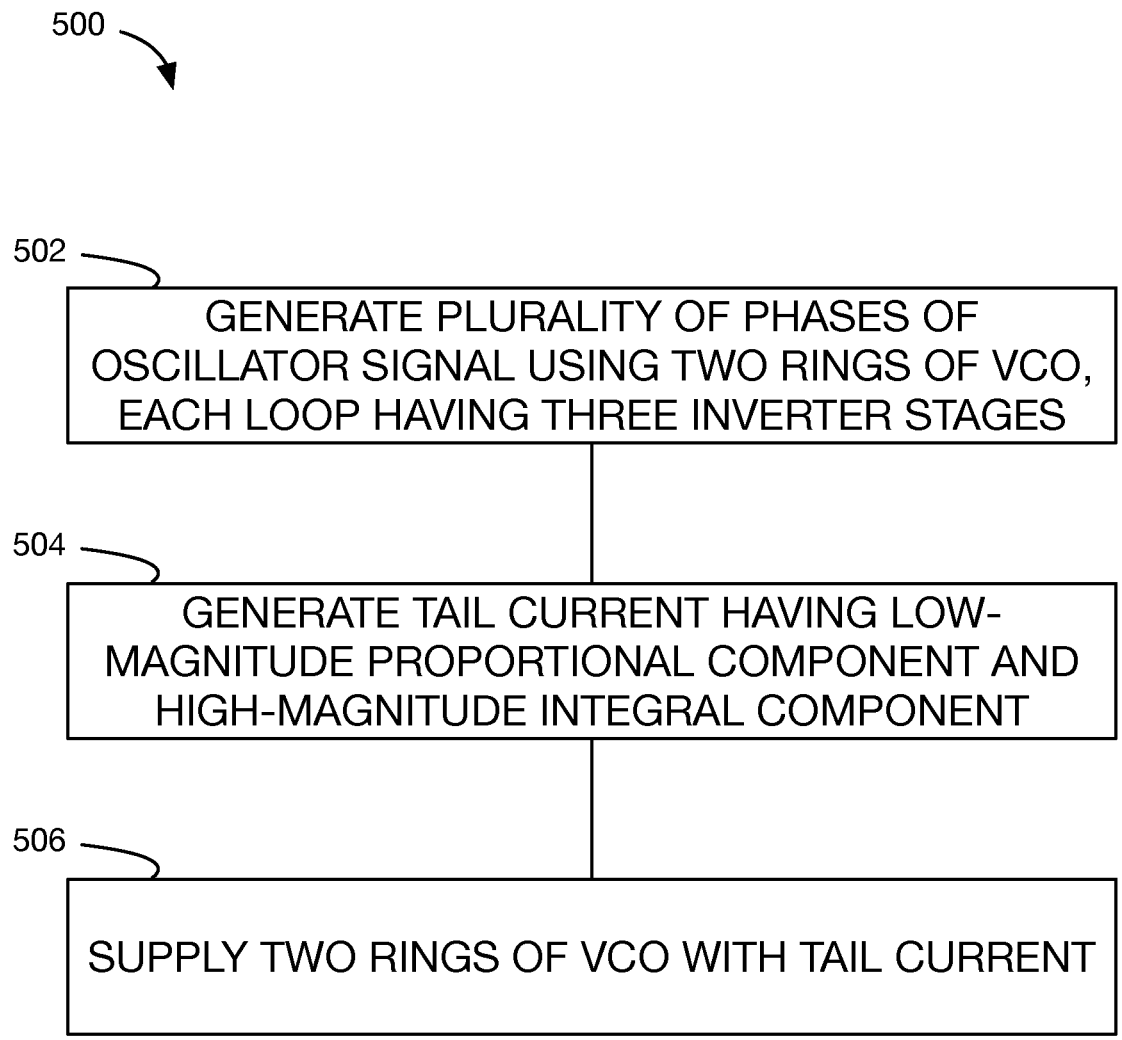
FIG. 5 is a flowchart of a method 500, in accordance with some embodiments.

FIG. 5 includes a flowchart of a method 500, in accordance with some embodiments. As shown, method 500 includes generating 502 a plurality of phases of an oscillator signal via two rings of a voltage-controlled oscillator (VCO). As shown in FIG. 1, each ring 110 and 150 of the two rings generates a subset of the phases of the plurality of phases of the oscillator signal at outputs of three stages of inverters. Furthermore, the subsets of the plurality of phases of the oscillator signal are inverse-phase locked using back-to-back inverters, e.g., 125 and 126. Each stage receives inputs from a previous stage in the ring and a feed-forward signal from a successive stage in the other ring of the two rings. A tail current is generated 504 at a tail current supply, the tail current having a low-magnitude proportional component associated with high-frequency phase comparisons and a high-magnitude integral component associated with an accumulation of phase comparison. The tail current is then supplied 506 to the two rings 110 and 150 of the VCO.

In some embodiments, the inverters e.g., 120 and 160, generating the subset of phases of the plurality of phases of the oscillator signal and the back-to-back inverters 125 and 126 cross coupling each stage to the corresponding stage in the other ring have different sizes. In some such embodiments, inverters 120 and 160 may have a relative size of 1×, and the back-to-back inverters 125 and 126 may have a relative size of <1×. In some embodiments, the back-to-back inverters 125 and 126 have a size of approximately 0.4× with respect to inverters 120 and 160. In some embodiments, feed-forward inverters 128 and 168 have a size of approximately 0.6× with respect to inverters 120 and 160.

In some embodiments, generating the tail current includes receiving control signals at input transistors and responsively generating the low-magnitude proportional component of the tail current and the high-magnitude integral component of the tail current. In some embodiments, the control signal for generating the low-magnitude proportional component of the tail current is received at an input transistor having a smaller size than an input transistor receiving the control signal for generating the high-magnitude integral component of the tail current. In some embodiments, the control signals for generating the low-magnitude proportional component of the tail current and for generating the high-magnitude integral component of the tail current are received at respective sets of equal-sized transistors. In some such embodiments, the respective set of equal-sized transistors receiving the control signal for generating the low-magnitude proportional component of the tail current includes a less amount of input transistors than the respective set of input transistors receiving the control signal for generating the high-magnitude integral component of the tail current. In some embodiments, the control signals are generated using a phase and frequency detection circuit (not shown).

One embodiment of a VCO includes two rings each having three stages of series-connected digital inverters, the two rings together providing differential (i.e. 180 degree offset) clock signals. Each ring feeds back on itself to maintain the three-inversion topology for oscillation with a (2*3*gate_delay) period. In the illustration of FIG. 1, first ring 110 is composed of inverters 120, 130, and 140, and second ring 150 is composed of inverters 160, 170, and 180.

To maintain an inverse-phase lock between the two rings, each ring node is cross-connected to its corresponding node on the other ring using back-to-back digital inverters, maintaining the desired 180 degree phase offset between corresponding nodes on the two rings. In such embodiments, the back-to-back inverters provide bidirectional synchronization between corresponding nodes on the two rings, as well as introducing a small amount of hysteresis into node switching transitions. Thus, the output of first ring node 120 is cross-connected to the output of second ring node 160 by inverters 125 and 126, the output of 130 is cross-connected to the output of 170 by inverters 135 and 136, and the output of 140 is cross-connected to the output of 180 by inverters 145 and 146.

As the desired ring oscillation frequency approaches the design limits of the embodiment's integrated circuit process, each ring node is also driven with a small amount of feed-forward signal from a node 60 degrees earlier in the oscillation cycle (which, in the example three inverting element two ring topology, may be obtained from a successive stage of the other ring.) This feed-forward signal begins to drive the node in anticipation of the switching transition, allowing operation at a higher frequency than would otherwise be possible. In FIG. 1, this feed-forward may be seen in inverter 128 driving an inverted and delayed version of ø300 (thus corresponding to a non-inverted ø120) onto output node ø240 in anticipation of primary inverter 120 driving an inverted and delayed version of ø000 (thus corresponding to a non-inverted ø180) onto the same node. Thus, in this example the feed-forward signal anticipates each corresponding change of primary output signal by 60 degrees, providing a beneficial pre-charging action which accelerates the transition of the output node.

Such anticipatory signaling cannot exceed that of the primary signal path, or spurious high-frequency oscillation can occur. Similarly, signaling on the cross-coupling path introduces hysteresis which delays switching transitions, so must also be constrained to be significantly less than that of the primary signal path. The amount of anticipatory and cross-coupled signaling may be controlled by scaling the size of the transistors (and thus their current drive capability) of the inverters relative to the transistor size of the inverters used on the primary signal path.

In one particular embodiment, feed-forward signaling was found to be of benefit at approximately 60% of the drive level of the primary signal path, with cross-coupling at approximately 40% of the drive level of the primary signal path. Smaller amounts of feed-forward signaling provided correspondingly smaller speed-up benefit. Larger amounts of cross-coupling increased the effective propagation delay of the active ring elements, and significantly smaller amounts reduced the desired locked phase relationship between the first and second rings.

Figure 2:
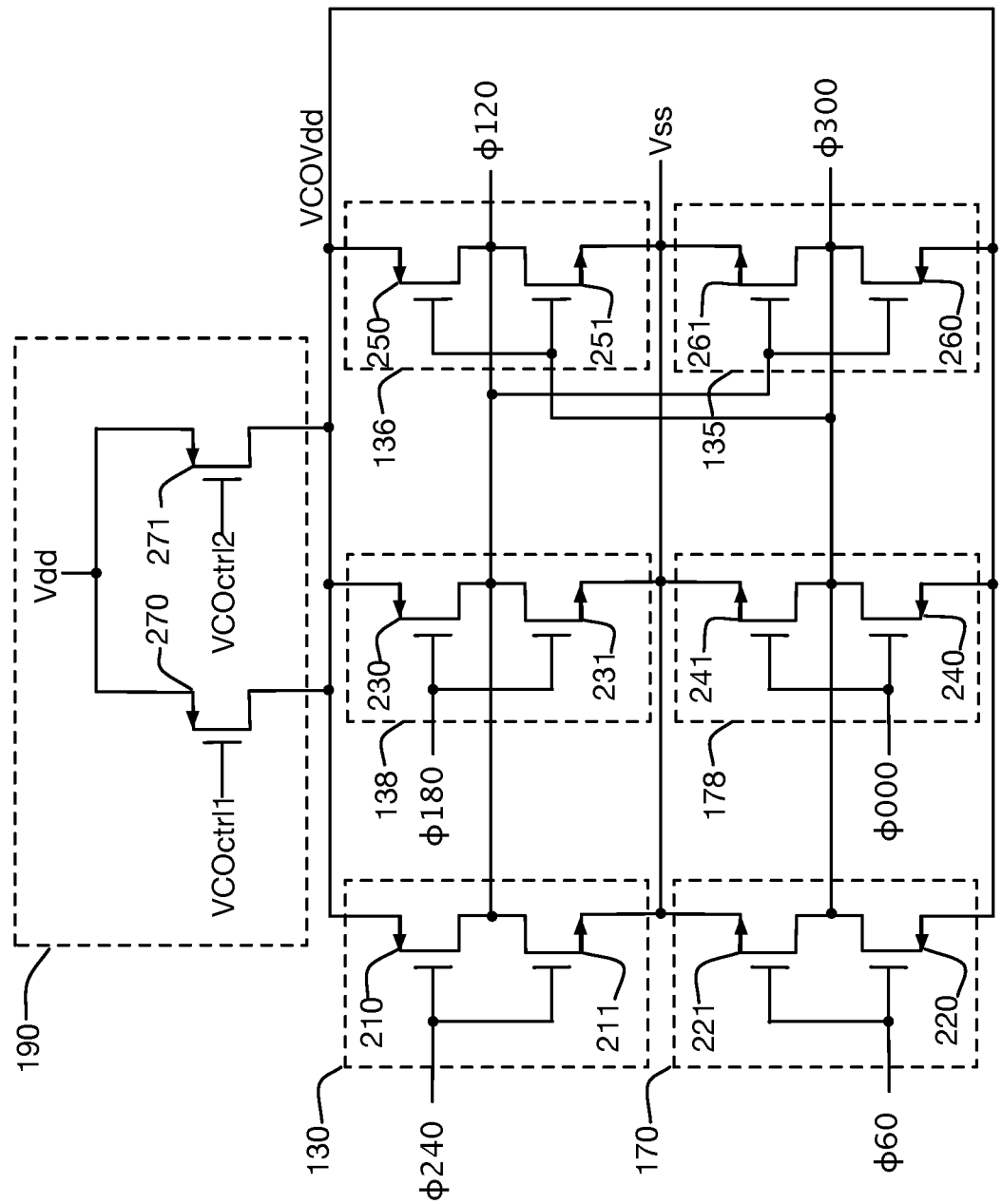
FIG. 2 is a schematic detailing one embodiment of cross-connected active ring elements.

FIG. 2 is a transistor-level illustration detailing one representative portion of the ring oscillator of FIG. 1, in particular the second active circuit elements of each ring, corresponding to primary path inverters 130 and 170, feed-forward inverters 138 and 178, and cross-coupled inverters 135 and 136. For purposes of illustration and without implying limitation, each inverter is drawn as a simple two transistor CMOS structure; thus primary inverter 130 of the first ring is composed of transistors 210 and 211, feed-forward inverter 138 is composed of transistors 230 and 231, and cross-coupled inverter 136 is composed of transistors 250 and 251, all driving common output node ø120. The internal elements of second ring inverters 170, 178, and 135 are identical to those of their corresponding first ring partners. In the particular embodiment described above, transistors 210, 211, 220, and 221 associated with the primary signal path are sized to provide design-typical output drive currents, herein described as produced by transistors of 1× channel dimensions. Feed-forward transistors 230, 231, 240, 241 are scaled to 0.6× channel dimensions, thus providing approximately 60% of the primary signal path output drive current. Cross-coupling transistors 230, 231, 240, 241 are scaled to 0.4× channel dimensions, thus providing approximately 40% of the primary signal path output drive current.

As the output current and thus the output slew rate of a CMOS inverter varies with according to supply voltage, the varying output slew rate of each inverter into its output node capacitance will result in a variation of propagation delay with supply voltage, providing a mechanism for adjusting the ring oscillation frequency. As shown in FIGS. 1 and 2, all ring inverters are powered by a controlled voltage VCOVdd, produced by power control circuit, e.g., tail current supply 190. Pass transistor 270 controlled by a first VCO control signal VCOctrl1 contributes to the collective tail current output by 190 onto controlled voltage bus VCOVdd; similarly, pass transistor 271 controlled by a second VCO control signal VCOctrl2 also contributes to the collective tail current output by 190. The relative channel size and thus current capability of pass transistors 270 and 271 may differ, allowing the relative control effect of the two control signals to differ. In one embodiment, VCOctrl1 is produced by a PLL component providing a proportional phase error component associated with high-frequency phase comparisons, and VCOctrl2 is produced by a PLL component providing an integral component associated with an accumulation of phase comparisons. In one particular instance of that embodiment, pass transistor 270 is smaller than pass transistor, allowing VCCctrl2 to provide a higher-magnitude, and VCCctrl1 to have a lower-magnitude effect on VCO frequency. In an alternative embodiment, each of pass transistors 270 and 271 are comprised of sets of one or more parallel instances of a pass transistor, the sets 270 and 271 thus collectively providing differing control effects in a ratio proportional to the number of transistors in set 270 versus the number of transistors in set 271.

Figure 3:
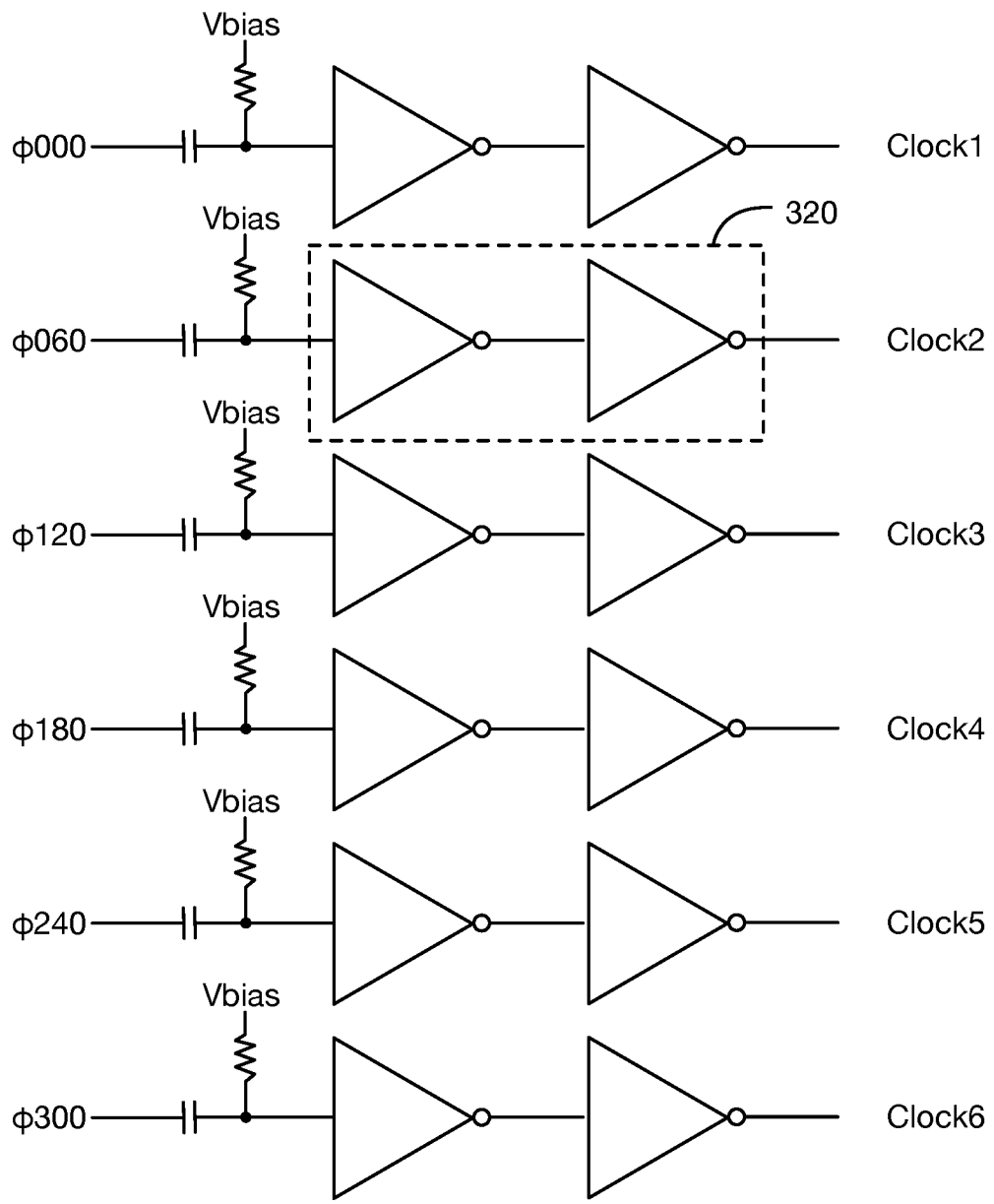
FIG. 3 shows one embodiment of output clock buffering.
Figure 4:
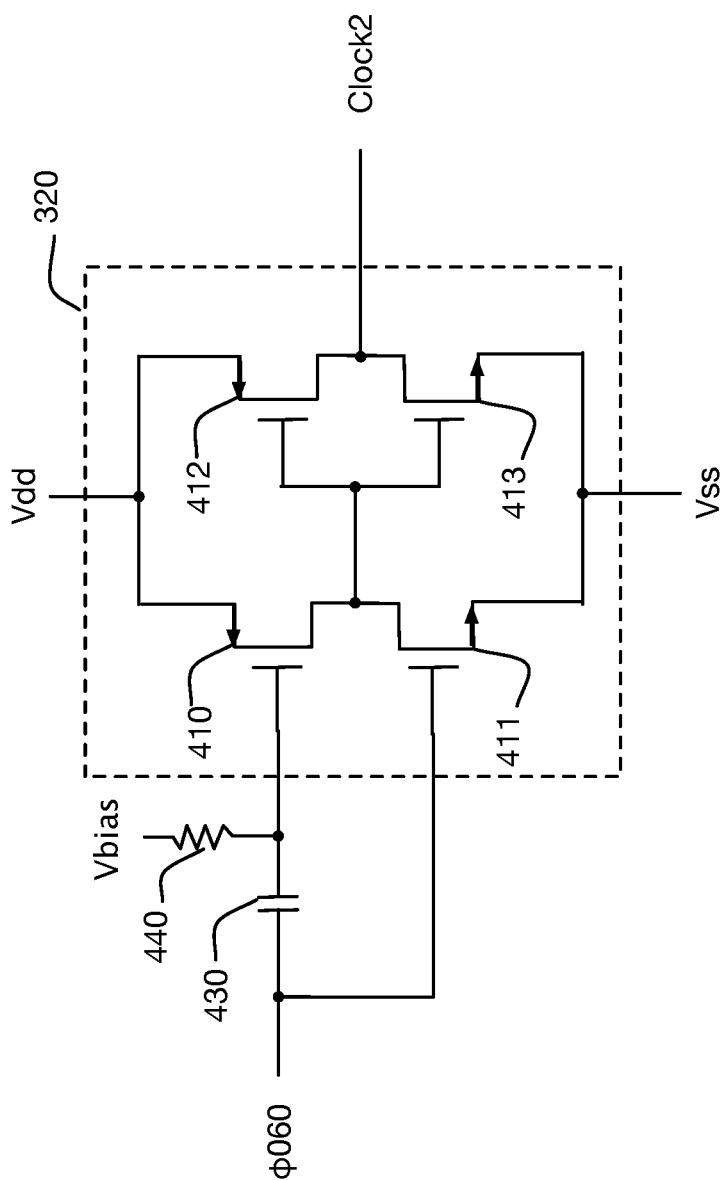
FIG. 4 illustrates an alternative output clock buffer embodiment.

For the inverter structures shown in FIG. 2, the output voltage swing at each ring node will span Vss to VCOVdd, i.e. a varying range. Thus, one embodiment capacitively couples each desired VCO output phase to a buffer/driver circuit as shown in FIG. 3, to provide a consistent output level and drive capability. A non-inverting buffer/driver (e.g. 320) is illustrated per clock phase, without implying limitation. A bias resistor and voltage supply is shown to provide any necessary input bias at the buffer/driver input. Embodiments utilizing a different digital logic family (e.g. CML) for the VCO elements may incorporate logic family level conversion into the design of FIG. 3. In at least one embodiment as shown in FIG. 4, the NMOS input transistors 411 and 413 of the buffer/driver 320 of FIG. 3 are driven directly by the VCO output, while the PMOS input transistors 410 and 412 for that buffer/driver are driven capacitively through capacitor 430 and further according to bias resistor 440.

The particular examples of three stages of active elements per ring and two rings do not imply a limitation in either minimum or maximum, although the available phase differences within a two element ring will generally preclude use of feed-forward speedup as described herein. Similarly, the CMOS ring inverters used for descriptive purposes above may alternatively utilize CML or other digital design conventions, or equivalent analog amplifier/buffer conventions.

The invention claimed is:

1. An apparatus comprising:
    two rings of a voltage controlled oscillator (VCO) configured to generate a plurality of phases of an oscillator signal, each ring of the two rings (i) comprising three stages of inverters configured to generate a subset of phases of the plurality of phases of the oscillator signal, (ii) cross coupled via each stage to a corresponding stage in an other ring of the two rings using inverters to inverse-phase lock the subsets of phases of the plurality of phases of the oscillator signal of the two rings, and (iii) configured to receive inputs at each stage from a previous stage in the ring and a feed-forward signal from a successive stage in the other ring of the two rings; and
    a tail current supply configured to supply the two rings of the VCO with a tail current, the tail current comprising a low-magnitude proportional component associated with high-frequency phase comparisons and a high-magnitude integral component associated with an accumulation of phase comparisons.

2. The apparatus of claim 1, wherein the inverters configured to generate the subset of phases of the plurality of phases of the oscillator signal and the inverters cross coupling each stage to the corresponding stage in the other ring have different sizes.

3. The apparatus of claim 2, wherein the inverters configured to generate the subset of phases of the plurality of phases of the oscillator signal have a size of 1×, and the inverters cross coupling each stage to the corresponding stage in the other ring have a size of <1×.

4. The apparatus of claim 3, wherein the inverters cross coupling each stage to the corresponding stage in the other ring have a size of approximately 0.4×.

5. The apparatus of claim 3, wherein the feed-forward signal from the successive stage is received at an inverter having a size of approximately 0.6×.

6. The apparatus of claim 1, wherein the tail current supply comprises input transistors configured to receive control signals to generate the low-magnitude proportional component of the tail current and the high-magnitude integral component of the tail current.

7. The apparatus of claim 6, wherein the control signal to generate the low-magnitude proportional component of the tail current is received at an input transistor having a smaller size than an input transistor receiving the control signal to generate the high-magnitude integral component of the tail current.

8. The apparatus of claim 6, wherein the control signals to generate the low-magnitude proportional component of the tail current and to generate the high-magnitude integral component of the tail current are received at respective sets of equal-sized transistors.

9. The apparatus of claim 8, wherein the respective set of equal-sized transistors receiving the control signal for generating the low-magnitude proportional component of the tail current comprises a less amount of input transistors than the respective set of input transistors receiving the control signal for generating the high-magnitude integral component of the tail current.

10. The apparatus of claim 6, further comprising a phase and frequency detection circuit configured to generate the control signals.

11. A method comprising:
generating a plurality of phases of an oscillator signal via two rings of a voltage controlled oscillator (VCO), each ring of the two rings (i) generating a subset of the phases of the plurality of phases of the oscillator signal at outputs of three stages of inverters, (ii) inverse-phase locking the subsets of phases of the plurality of phases of the oscillator signal of the two rings of each stage to a corresponding stage in an other ring of the two rings using inverters, and (iii) receiving inputs at each stage from a previous stage in the ring and a feed-forward signal from a successive stage in the other ring of the two rings;
generating a tail current at a tail current supply, the tail current comprising a low-magnitude proportional component associated with high-frequency phase comparisons and a high-magnitude integral component associated with an accumulation of phase comparison; and
supplying the two rings of the VCO with the tail current.

12. The method of claim 11, wherein the inverters generating the subset of phases of the plurality of phases of the oscillator signal and the inverters cross coupling each stage to the corresponding stage in the other ring have different sizes.

13. The method of claim 12, wherein the inverters generating the subset of phases of the plurality of phases of the oscillator signal have a size of 1×, and the inverters cross coupling each stage to the corresponding stage in the other ring have a size of <1×.

14. The method of claim 13, wherein the inverters cross coupling each stage to the corresponding stage in the other ring have a size of approximately 0.4×.

15. The method of claim 13, wherein the feed-forward signal from the successive stage is received at an inverter having a size of approximately 0.6×.

16. The method of claim 11, generating the tail current comprises receiving control signals at input transistors and responsively generating the low-magnitude proportional component of the tail current and the high-magnitude integral component of the tail current.

17. The method of claim 16, wherein the control signal to generate the low-magnitude proportional component of the tail current is received at an input transistor having a smaller size than an input transistor receiving the control signal to generate the high-magnitude integral component of the tail current.

18. The method of claim 16, wherein the control signals to generate the low-magnitude proportional component of the tail current and to generate the high-magnitude integral component of the tail current are received at respective sets of equal-sized transistors.

19. The method of claim 18, wherein the respective set of equal-sized transistors receiving the control signal for generating the low-magnitude proportional component of the tail current comprises a less amount of input transistors than the respective set of input transistors receiving the control signal for generating the high-magnitude integral component of the tail current.

20. The method of claim 16, wherein the control signals are generated using a phase and frequency detection circuit.

* * * * *